United States Patent [19]
Busch et al.

[11] Patent Number: 5,530,836
[45] Date of Patent: Jun. 25, 1996

[54] METHOD AND APPARATUS FOR MULTIPLE MEMORY BANK SELECTION

[75] Inventors: Robert E. Busch, Essex Junction; Endre P. Thoma, Colchester, both of Vt.

[73] Assignee: International Business Machines Corporation, Armonk, N.Y.

[21] Appl. No.: 289,830

[22] Filed: Aug. 12, 1994

[51] Int. Cl.$^6$ .......................... G06F 12/06; G06F 13/00
[52] U.S. Cl. .................. 395/477; 395/312; 395/476; 395/478; 395/495; 364/243.6; 364/926.92; 364/959; 364/DIG. 1; 365/189.02; 365/230.02; 365/230.03; 365/280.06
[58] Field of Search ........................ 364/238.5, 239.51, 364/243.6, 246.3, 926.92, 959, 966.7; 365/189.02, 230.02, 230.03, 230.06; 395/312, 476, 477, 478, 495

[56] References Cited

U.S. PATENT DOCUMENTS

| | | | |
|---|---|---|---|
| 4,384,342 | 5/1983 | Imura et al. | 395/405 |
| 4,797,850 | 1/1989 | Amitai | 395/433 |
| 4,908,789 | 3/1990 | Blokkum et al. | 395/497.03 |
| 4,967,397 | 10/1990 | Walck | 365/222 |
| 5,005,157 | 4/1991 | Catlin | 365/193 |
| 5,129,059 | 7/1992 | Hannah | 395/166 |
| 5,146,430 | 9/1992 | Torimaru et al. | 365/222 |
| 5,159,676 | 10/1992 | Wicklund et al. | 395/425 |
| 5,179,687 | 1/1993 | Hidaka et al. | 395/425 |
| 5,185,719 | 2/1993 | Dhong et al. | 365/189.01 |
| 5,371,866 | 12/1994 | Cady | 395/421.01 |
| 5,392,252 | 2/1995 | Rimpo et al. | 365/230.02 |
| 5,396,608 | 3/1995 | Garde | 395/410 |

*Primary Examiner*—Tod R. Swann
*Assistant Examiner*—Frank J. Asta
*Attorney, Agent, or Firm*—Heslin & Rothenberg; Wayne F. Reinke

[57] ABSTRACT

In one aspect a memory bank selection system includes two asynchronous RAS pins and a single CAS pin, a switching circuit for each memory bank and a bank address decoder with an output to each switching circuit. The RAS pins are available to all of the switching circuits. A given switching circuit selects its associated bank if an active RAS signal is present and the bank address decoder output was sent thereto. The number of memory banks that can be simultaneously active directly depends on the number of RAS inputs. In another aspect, the number of CAS pins is equal to the number of asynchronous RAS pins.

15 Claims, 9 Drawing Sheets fig. 1
PRIOR ART fig. 2
PRIOR ART fig. 3 fig. 4 fig. 5 fig. 7 fig. 8 fig. 9

METHOD AND APPARATUS FOR MULTIPLE MEMORY BANK SELECTION

BACKGROUND OF THE INVENTION

1. Technical Field

The present invention generally relates to memory accessing schemes. More particularly, the present invention relates to memory bank selection.

2. Background Art

As memory densities, in particular that of dynamic random access memory (DRAM), continue to increase, accessing efficiency becomes more of an issue. High density memory modules may be partitioned into units referred to as "banks". In the past, each bank has required individual select signals, such as row address select (RAS) and column address select (CAS), for accessing. In addition, typically only one bank at any given time may be active. Access efficiency would be increased if the number of select signals needed could be reduced, since the number of select signal inputs or pins would be reduced, and multiple banks could be active simultaneously.

One solution has been to clock a single set of select or enable signals used for any bank together with a bank address. In this way, one bank may be selected, and then another while the first is still selected. However, this entirely synchronous solution degrades performance, since even if the enable signals become active, no selection can occur until the clock signal is available. Therefore, it would be desirable to maintain the performance benefits of asynchronous enable signals without resorting to dedicated enable signals for each memory bank.

Another solution has been to use an enable signal decoder for a minimum number of enable signals to select from among a larger number of memory banks. However, in this scheme, only one bank at a time may be selected. Therefore, it would be desirable to select multiple banks simultaneously.

Thus, a need exists for a way to reduce the number of enable signal inputs needed for memory bank selection and allow multiple simultaneous memory bank selection, while maintaining the performance benefits of asynchronous enable signals.

SUMMARY OF THE INVENTION

Briefly, the present invention satisfies the above need by providing an asynchronous selection scheme utilizing a decoder for a bank address controlling an array of switches that determine which bank or banks will be selected.

In accordance with the above, it is an object of the present invention to reduce the number of memory bank enable inputs needed for memory bank selection.

It is another object of the present invention to preserve the performance benefits of asynchronous selection.

It is still another object of the present invention to provide multiple simultaneous memory bank selection.

The present invention provides, in a first aspect, a memory bank selection system. The system comprises a plurality of memory banks and a plurality of asynchronous enable inputs to the plurality of memory banks. The number of memory banks exceeds the number of asynchronous enable inputs. The system also comprises a decoder for decoding a bank address. In addition, the system comprises a plurality of switches responsive to output from the decoder and the plurality of asynchronous enable inputs for selecting from among the plurality of memory banks such that multiple memory banks may be selected simultaneously.

The system may also comprise at least one other enable input of a different type than the plurality of asynchronous enable inputs. In one embodiment, the asynchronous enable inputs are RAS inputs and the at least one other enable input is a CAS input. A signal applied at the at least one other enable input may act as a strobe for the bank address.

The present invention also provides, in a second aspect, a method for selecting from among a plurality of memory banks in a system including a plurality of asynchronous enable inputs and a plurality of bank address inputs, the memory banks exceeding in number the asynchronous enable inputs. The method comprises applying an enable signal at one of the plurality of asynchronous enable inputs, applying a bank address signal at the plurality of bank address inputs, decoding the applied bank address signal and automatically selecting a first memory bank based on the applied enable signal and the decoded bank address signal. Another bank may be simultaneously selected by applying an enable signal at another of the asynchronous enable inputs, applying and decoding another bank address signal and automatically selecting a second bank based on the latter applied enable signal and bank address. The step of automatically selecting a bank may comprise automatically creating a connection between the respective asynchronous enable input and one of the banks via switches connected therebetween.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
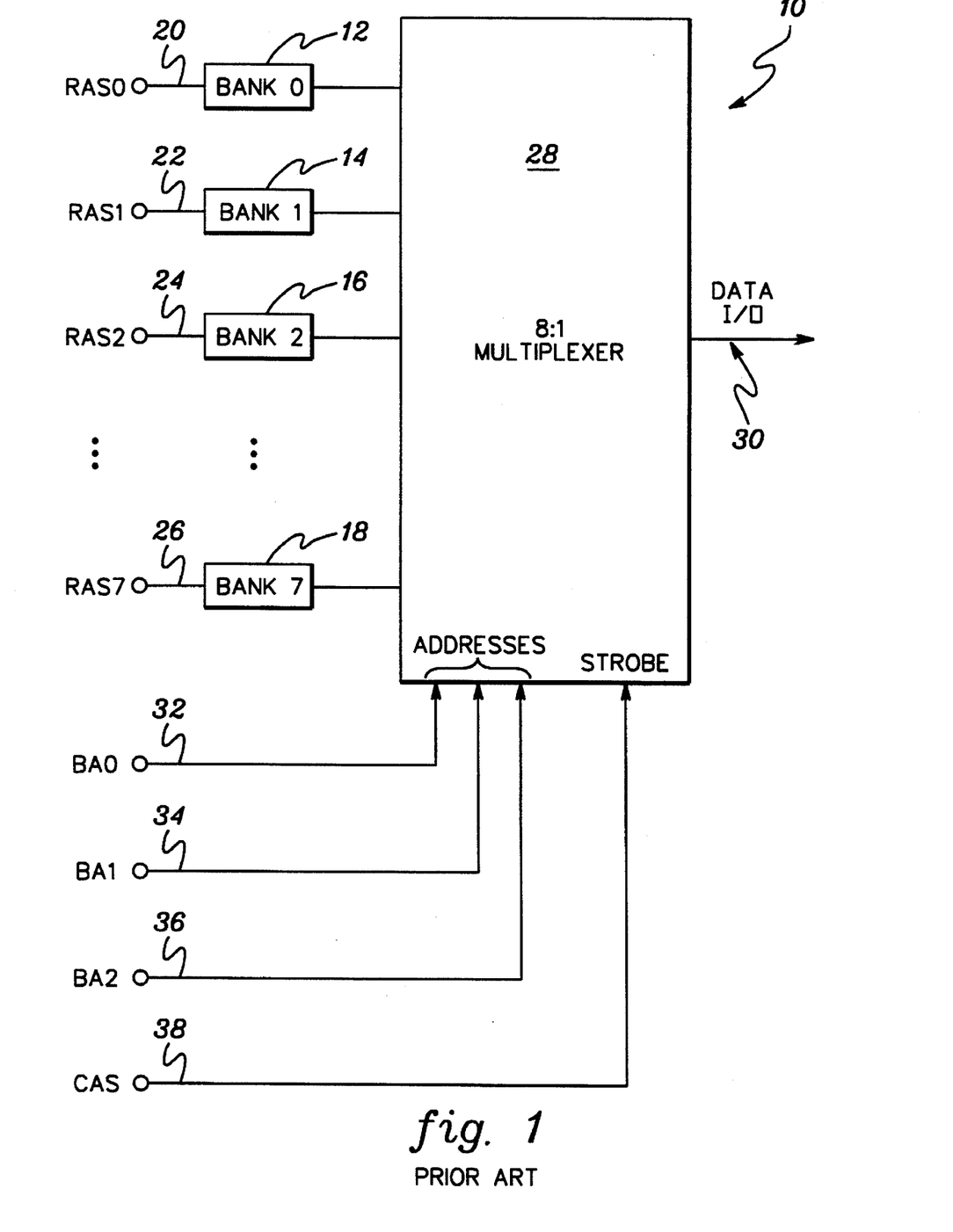
FIG. 1 is a block diagram of a simplified prior art bank selection system.

FIG. 1 depicts, in block diagram form, a simplified prior art bank selection system 10. Bank selection system 10 includes eight memory banks, e.g., 12, 14, 16 and 18, each having a dedicated RAS input thereto, 20, 22, 24 and 26, respectively. Each memory bank is connected to eight-to-one multiplexer 28, the output of which is the data input and output 30 for the eight banks. The control signals for multiplexer 28 are bank address inputs 32, 34 and 36, as well as CAS input 38. A CAS signal on input 38 strobes in the bank addresses on lines 32, 34 and 36. Multiplexer 28 connects the appropriate bank with Data I/O 30 for information transfer via time multiplexed addressing.

Figure 2:
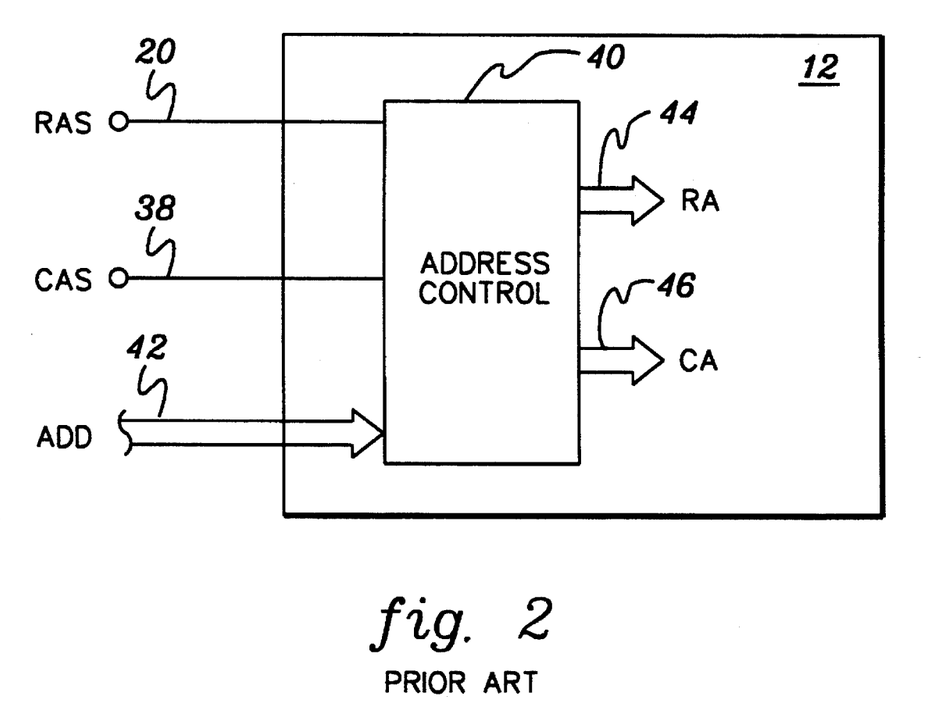
FIG. 2 is a block diagram of one of the memory banks of FIG. 1.

FIG. 2 is a more detailed block diagram of bank 12 in FIG. 1, showing in general how a particular memory location in bank 12, exemplary of all the banks in FIG. 1, is accessed via row addresses and column addresses. Within bank 12 is address control 40, whose input is RAS line 20, CAS line 38 and addressing signals 42, and whose output is row address 44 and column address 46. Row address 44 will be whatever address is present on address inputs 42 when a RAS signal on RAS input 20 becomes active. Similarly, column address 46 will be whatever address is present on address lines 42 when a CAS signal on CAS line 38 becomes active.

Figure 3:
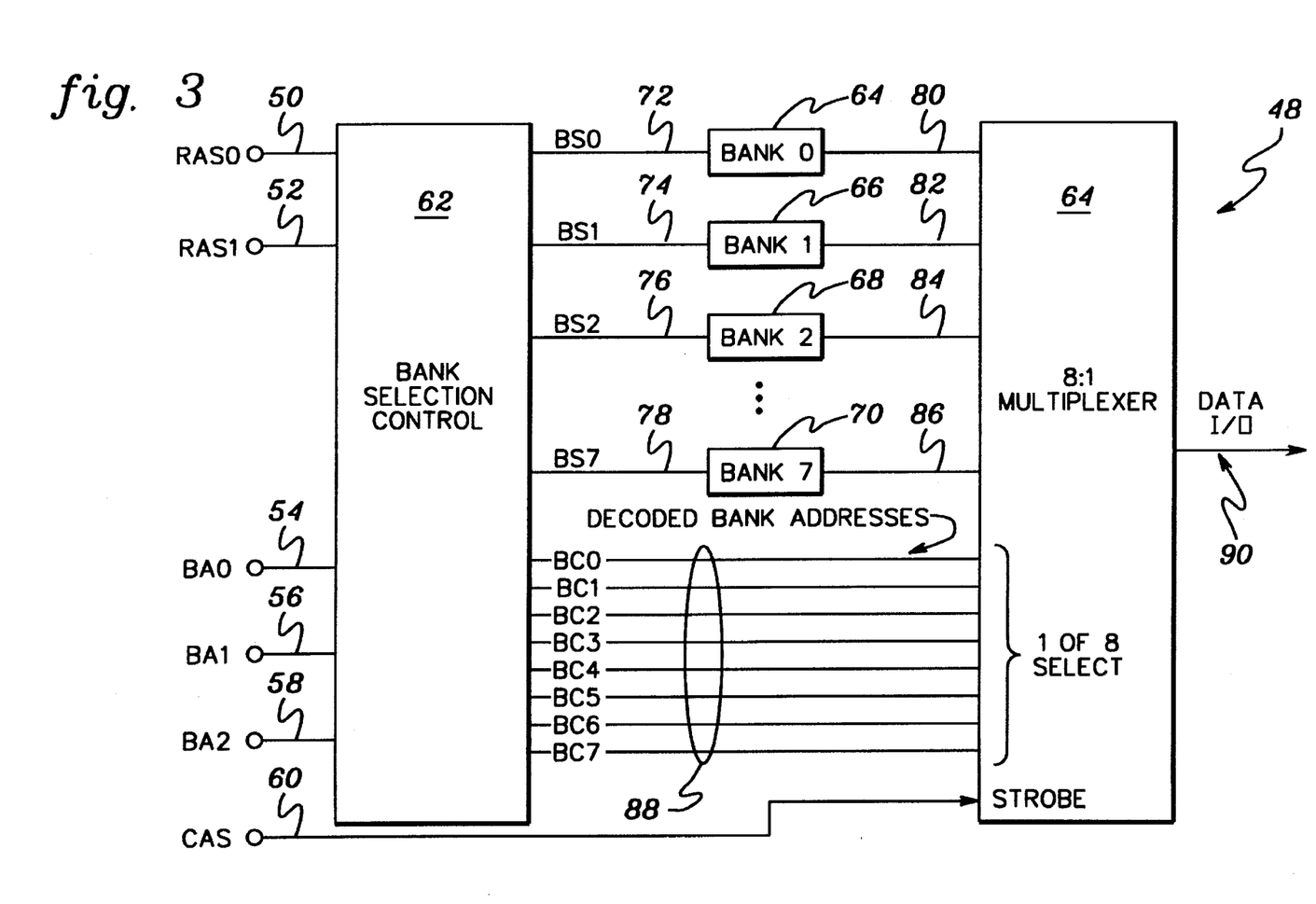
FIG. 3 is a block diagram of a simplified bank selection system according to the present invention.

FIG. 3 is a simplified block diagram of an exemplary bank selection system 48 according to the present invention. System 48 includes RAS inputs 50 and 52, bank address inputs 54, 56 and 58, and CAS input 60. Also included in system 48 are bank selection control 62, eight memory banks (e.g., banks 64, 66, 68 and 70) and eight-to-one multiplexer 64. Bank selection signals are input to the banks over lines 72, 74, 76 and 78, respectively. Data is transferred between the banks and Data I/O 90 via multiplexer 64 over lines 80, 82, 84 and 86, respectively. Bank addresses input to bank selection control 62 are decoded thereby and output over lines 88 to multiplexer 64.

The general operation of system 48 will now be described. For the purposes of the exemplary embodiments described herein, assume that both RAS and CAS signals are active low. Bank selection control 62 serves the purpose of not only decoding bank address signals input at bank address inputs 54, 56 and 58, as indicated above, but also allows a given RAS signal applied at RAS inputs 50 or 52 to select one of the eight banks for activation. In the present embodiment, a given RAS input signal may only select a single bank. As a CAS signal on CAS input 60 becomes active, the active CAS signal serves to strobe in a decoded bank address over lines 88 into multiplexer 64. Based on the control signals to multiplexer 64, i.e., the decoded bank addresses and CAS signal, multiplexer 64 allows data I/O 90 to connect with an output line from one of the banks.

Figure 4:
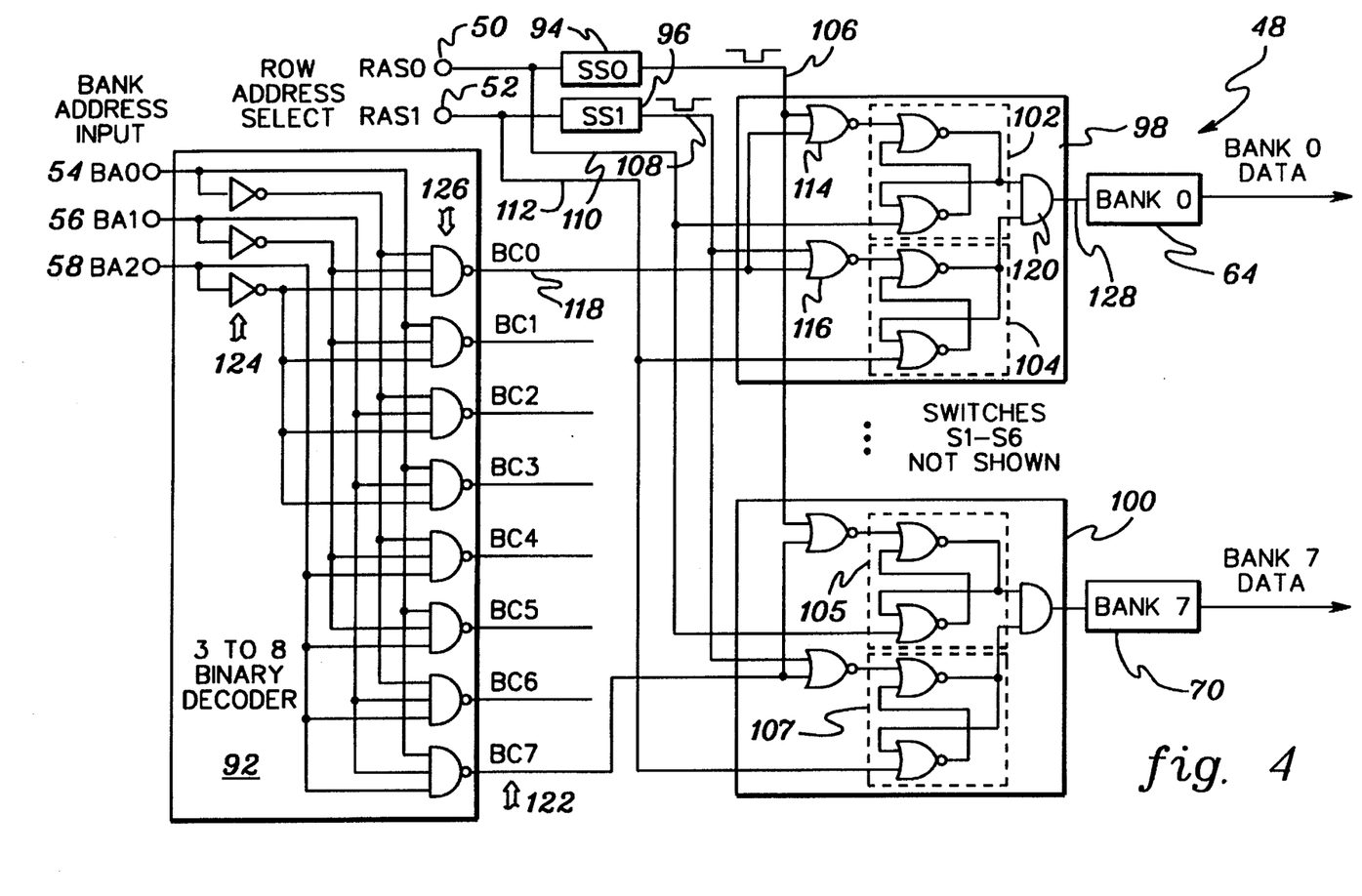
FIG. 4 depicts detail of the exemplary bank selection system of FIG. 3.

FIG. 4 depicts detail of the simplified bank selection system 48 of FIG. 3. More specifically, FIG. 4 depicts detail regarding the bank selection control 62 of FIG. 3. Bank selection control 62 comprises binary decoder 92, falling edge triggered single shot circuits 94 and 96, and switching circuits 98 and 100 (hereinafter each referred to as a "switch"). It will be understood that although not shown in FIG. 4, each of the eight banks, e.g., banks 64 and 70, have a switch associated therewith. Each of circuits 94 and 96 serves to generate a SET pulse for use by latches in the switches (e.g., latches 102 and 104 in switch 98) over lines 106 and 108, respectively, on the falling edge of a RAS signal applied at the respective RAS input. The actual RAS signals applied at inputs 50 and 52 are used as RESET signals, when going from the active state to the inactive state for the latches in the switches over lines 110 and 112, respectively. In addition, output from a selected bank could be latched so that it remains valid even after the relevant RAS signal has become inactive, at least until the relevant CAS signal also becomes inactive.

Switch 98, exemplary of the switches in system 48, includes two latches 102 and 104 with SET and RESET control. Each latch comprises two NOR gates coupled as shown. Switch 98 also includes: NOR gate 114, which provides the SET signal to latch 102 when an active low SET pulse is present on line 106 and an active low switch control signal is present on line 118 out of binary decoder 92; NOR gate 116, which provides the SET signal to latch 104 when an active low SET pulse is present on line 108 and an active low switch control signal is present on line 118 out of binary decoder 92; and AND gate 120, whose output acts as an active low selection signal for bank 64 when either of the outputs of latches 102 and 104 indicates a setting thereof. A memory controller at the system level (not shown) ensures that both latches 102 and 104 are never simultaneously set.

Decoder 92 is a three-to-eight binary decoder. As one skilled in the art will recognize, the decoder size will of course depend on the number of bank address inputs, which in turn depends on the number of banks. In the present exemplary embodiment, there are eight memory banks, thus three bank address inputs are needed with eight outputs, e.g., output line 118, collectively decoder outputs 122. Decoder 92 includes three inverters, collectively 124, to invert the addressing signals applied at bank address inputs 54, 56 and 58, as well as NAND gates 126 to recognize each possible bank address.

A working example of bank selection system 48 in FIG. 4 will now be described. Assume that a RAS signal applied at RAS input 52 becomes active (low) and a bank address (000) is input at bank address inputs 54, 56 and 58. An active RAS signal at RAS input 52 causes single shot circuit 96 to emit a SET pulse over line 108. An address of 000 causes decoder 92 to emit an active low switch control signal over line 118. The presence of a SET signal on line 108 as well as a switch control signal on line 118 causes NOR gate 116 to emit a SET signal to latch 104 in switch 98. With the setting of latch 104, AND gate 120 emits a bank selection signal over line 128 into bank 64, causing selection thereof. Bank 64 remains selected until the RAS signal at RAS input 52 returns to its inactive high state, causing a RESETing of latch 104.

Figure 5:
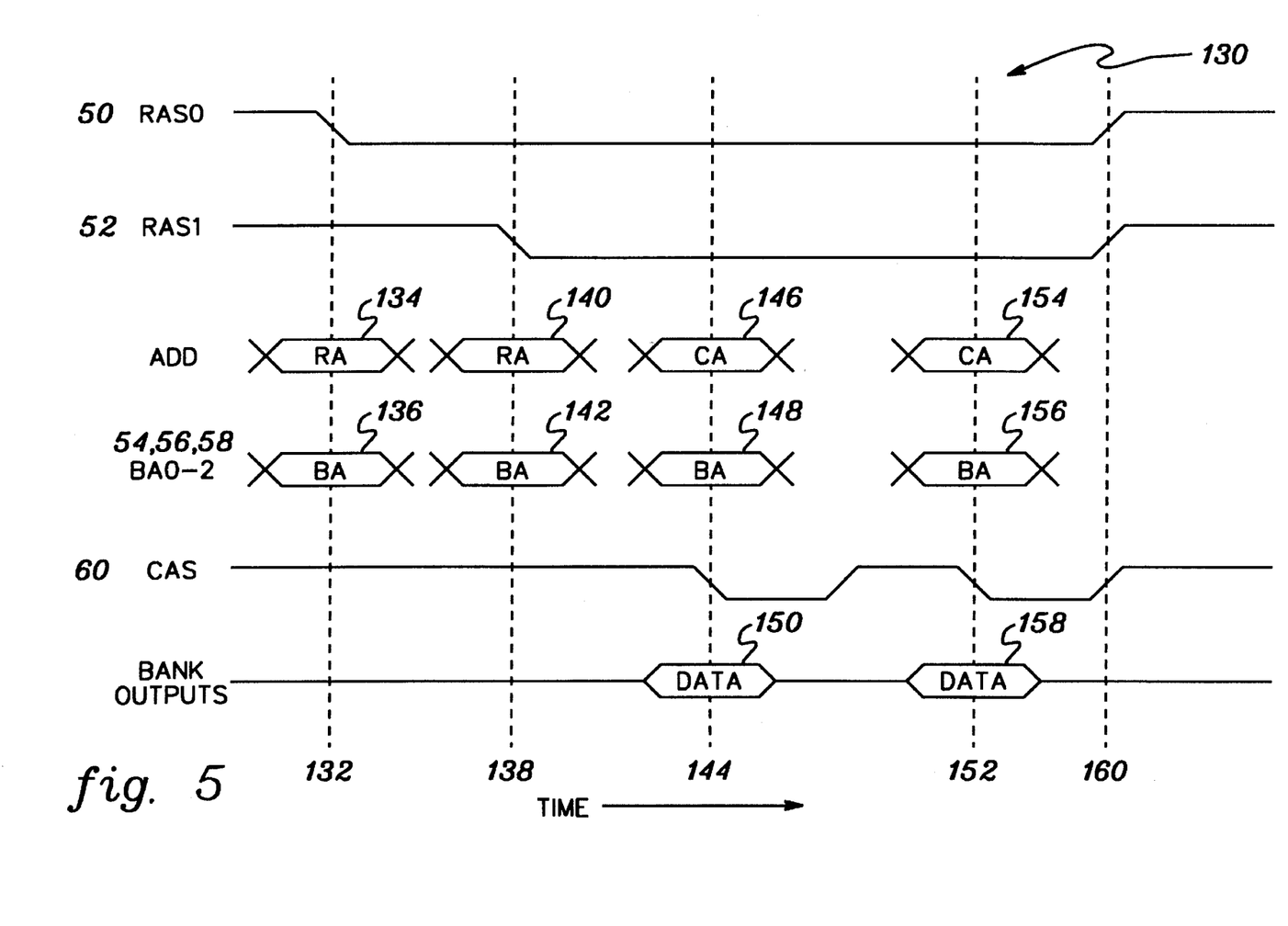
FIG. 5 is a timing diagram of a read operation for the bank selection system of FIGS. 3 and 4.

FIG. 5 is a timing diagram 130 for a read operation of bank selection system 48 of FIGS. 3 and 4. Assume that each memory bank includes an address control as described with respect to FIG. 2. At time 132, a RAS signal at RAS input 50 becomes active, strobing in both a row address 134 into bank 64, and a decoded bank address into switch 98 via a SET pulse. Assume that the row address 134 and bank address 136 are meant for bank 64. At time 138, a RAS signal at RAS input 52 becomes active, strobing in a row address 140 and bank address 142. Assume that row address 140 and bank address 142 are meant for bank 70. At time 144, a CAS signal at CAS input 60 becomes active, strobing in a column address 146 and bank address 148 for bank 64. At this point, bank 64 has been selected at time 132 and has both a row address 134 and column address 146, allowing bank 64 to output data 150. Similarly, at time 152, the CAS signal again becoming active at CAS input 60 strobes in column address 154 and bank address 156 for bank 70, allowing it to output data 158 therefrom. Finally, at time 160 both RAS signals and the CAS signal return to their inactive high state.

Figure 6:
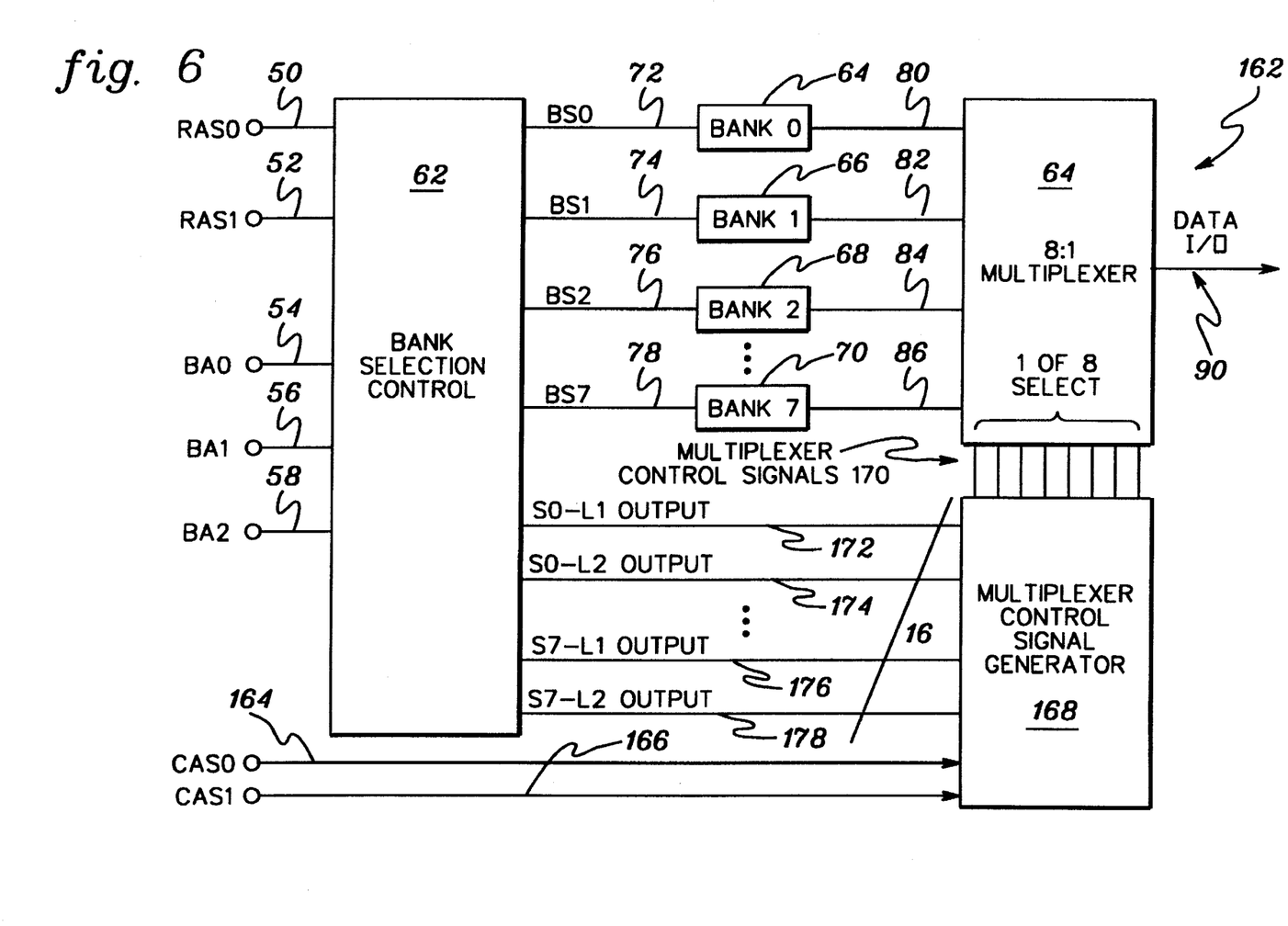
FIG. 6 is a simplified block diagram of another exemplary bank selection system according to the present invention.

FIG. 6 is a simplified block diagram of a second exemplary bank selection system 162 according to the present invention. Common with system 48 are the eight banks, bank selection control 62, RAS inputs 50 and 52, bank address inputs 54, 56 and 58, multiplexer 64 and Data I/O 90. The basic difference between system 162 and system 48 of FIG. 3 are multiple CAS inputs 164 and 166, CAS input 164 corresponding to RAS input 50 and CAS input 166 corresponding to RAS input 52. Thus, in the embodiment of FIG. 6, there are equal numbers of RAS and CAS inputs. The contents of bank selection control 62 include that which was described with respect to system 48, namely, decoder 92, single shot circuits 94 and 96, and switches (e.g., 98 and 100). Instead of decoded bank addresses 88 in FIG. 3, system 162 shows multiplexer control signal generator 168, the output of which acts as the control signals 170 for multiplexer 64. The inputs to multiplexer control signal generator 168 are the outputs from all latches in the switches and CAS inputs 164 and 166. For example, line 172 carries the output of latch 102 in switch 98, line 174 carries the output of latch 104 in switch 98, line 176 carries the output of latch 105 in switch 100 and line 178 carries the output of latch 107 in switch 100.

Figure 7:
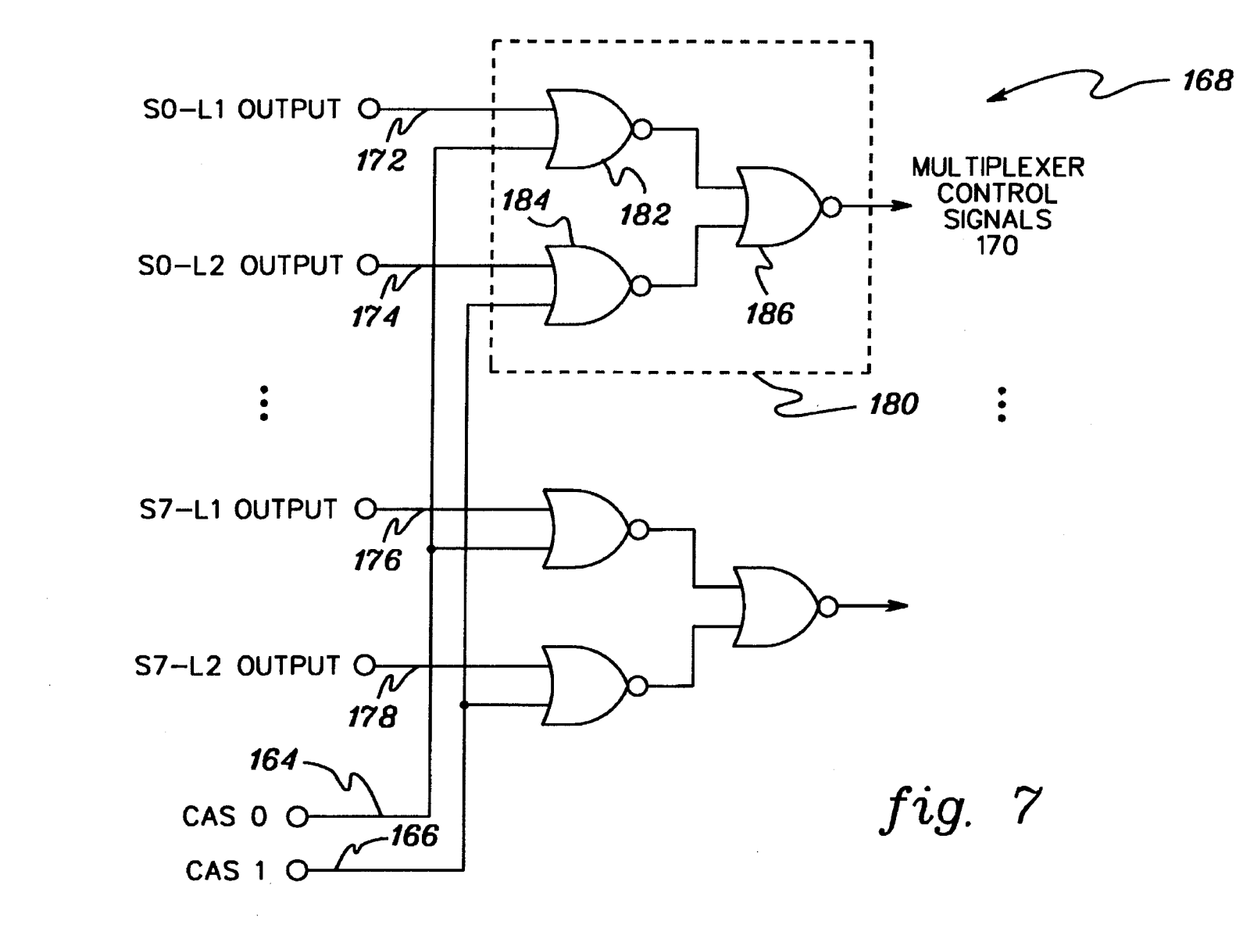
FIG. 7 is a detailed diagram of the Multiplexer Control Signal Generator of FIG. 6.
Figure 8:
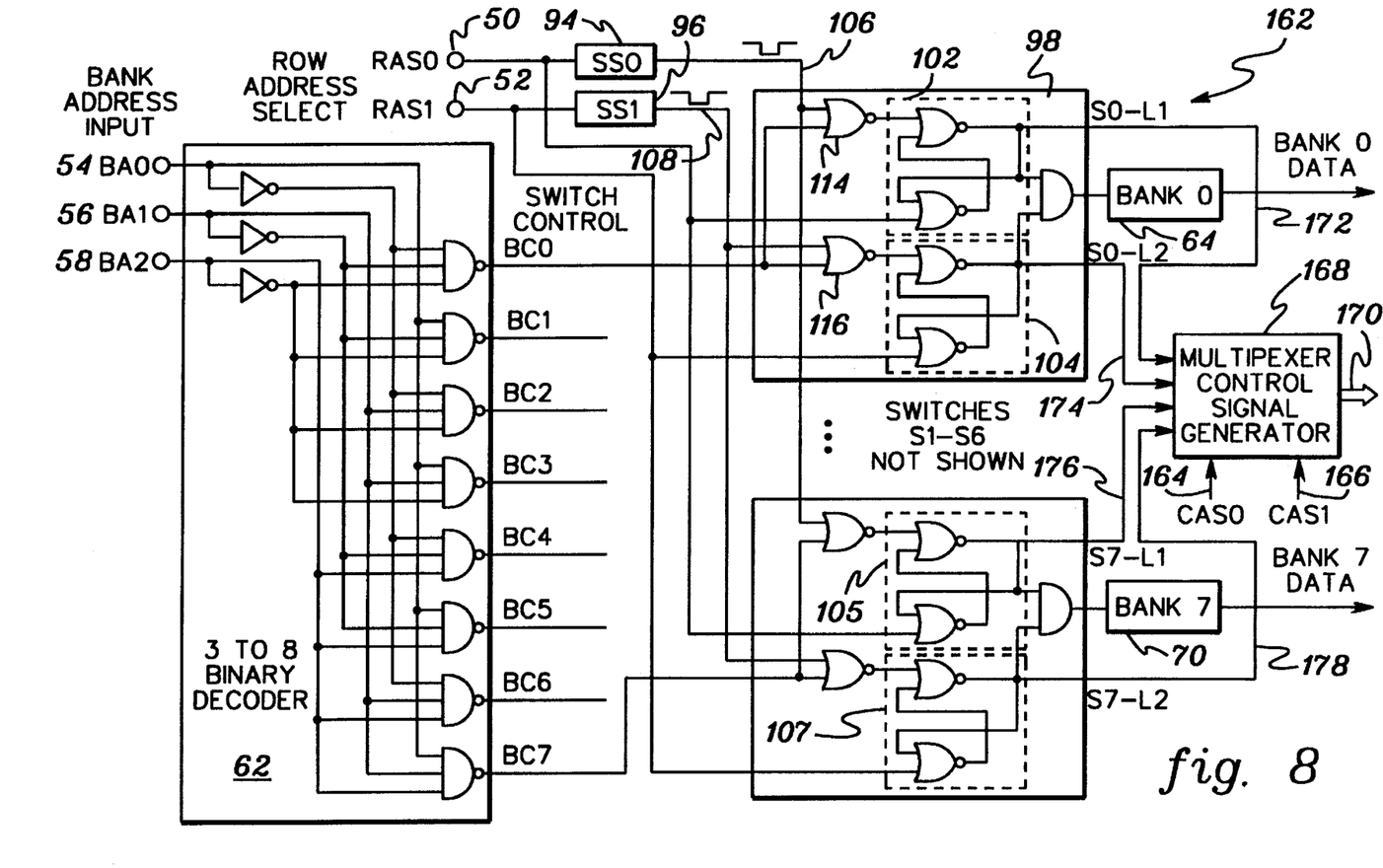
FIG. 8 depicts detail of the exemplary bank selection system of FIG. 6.

FIG. 7 depicts detail of multiplexer control signal generator 168 of FIG. 6. Included in generator 168 is a logic subcircuit, e.g., 180, for each of the eight banks in system 162. The contents and operation of logic subcircuit 180 will now be described, and it will be understood that the other logic subcircuits of generator 168 are similar. Logic subcircuit 180 includes NOR gates 182, 184 and 186. The inputs to NOR gate 182 are line 172, the output of latch 102, and CAS input 164. The inputs to NOR gate 184 are line 174, the output of latch 104 of switch 98 and CAS input 166. The inputs to NOR gate 186 are the outputs of NOR gates 182 and 184, with the output of NOR gate 186 acting as one of the multiplexer control signals 170. FIG. 8 depicts detail for selection system 162 with the same elements as FIG. 4, except that latch outputs (e.g., 172, 174, 176 and 178) are shown going to multiplexer control signal generator 168.

The operation of logic subcircuit 180 will now be described in detail by way of an example. Assume that a RAS signal on RAS input 50 falls and then a CAS signal applied at CAS input 164 falls. Bank 64 will be selected as a result of the active RAS signal. The latch output on line 172 goes low as the RAS signal falls, because latch 102 is set by bank address 000 when the RAS signal on RAS input 50 falls. Prior to the CAS signal on CAS input 164 falling, the output of latch 102 over line 172 was low, thus the output of NOR gate 182 was low. Also, the output of latch 104 is high at this time thus the output of NOR gate 184 is low. Since the inputs to NOR gate 186 would both be low, the output thereof will be an inactive high multiplexer control signal. As the CAS signal on CAS input 164 goes low, the output of NOR gate 182 goes high. NOR gate 182 will have an active high output when both inputs thereto are low. The action of NOR gate 184 is similar to that of 182. Thus, as the output of NOR gate 182 goes high, the output of NOR gate 184 is inactive low, since the output of latch 104 over line 174 is high. NOR gate 186 also operates similar to that of NOR gate 182 and outputs an active low multiplexer control signal, since the output from NOR gate 182 is high and the output of NOR gate 184 is low.

Figure 9:
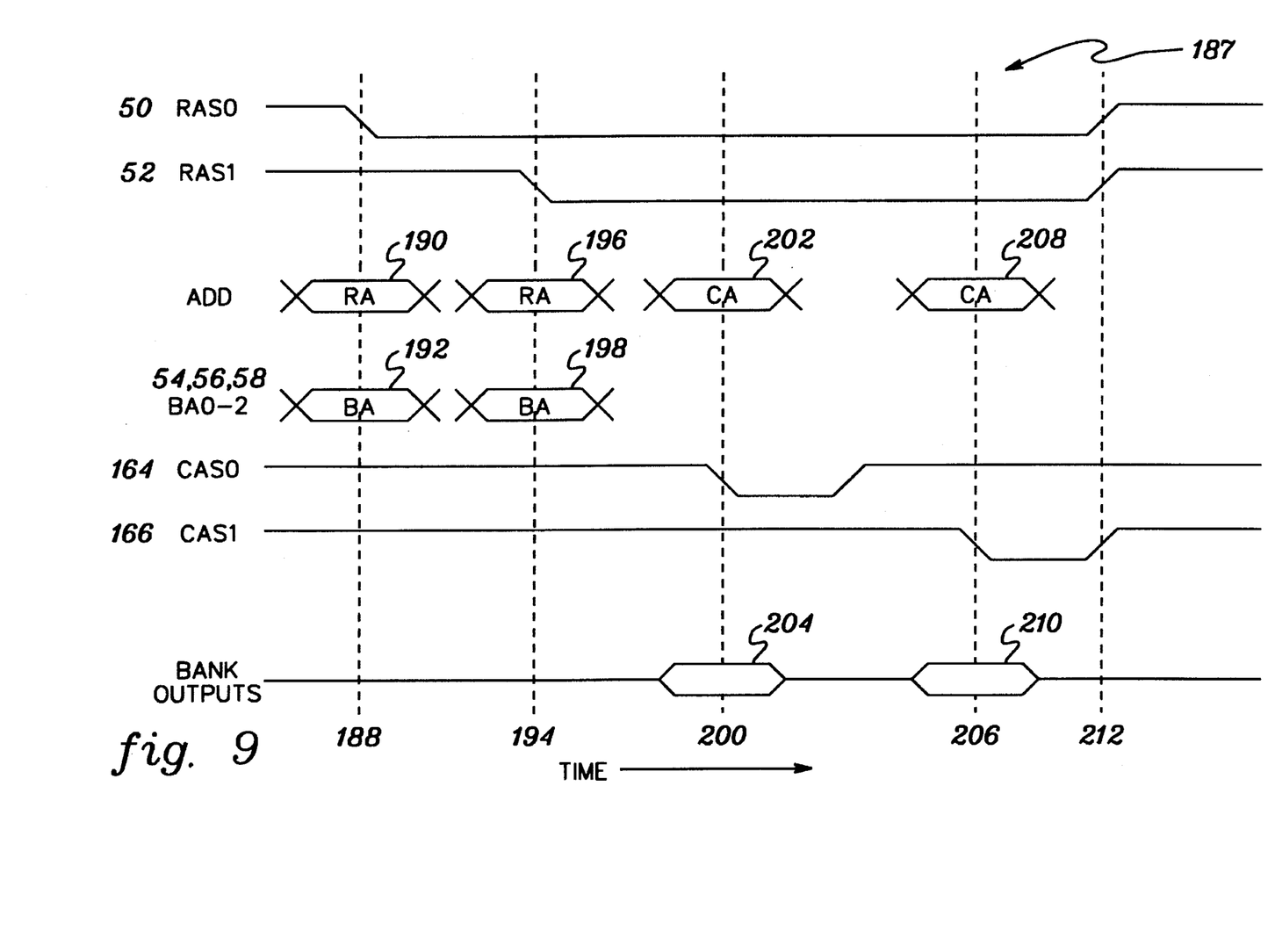
FIG. 9 is a timing diagram of a read operation for the bank selection system of FIG. 8.

FIG. 9 is a timing diagram for a read operation of the bank selection system 162 of FIG. 8 where two banks are simultaneously selected; that is, they are both active at the same time. At time 188, a RAS signal at RAS input 50 falls to the active state, strobing row address 190 into bank 64, and also strobing decoded bank address 192 into switch 98. Similarly, at time 194, a RAS signal at RAS input 52 becomes active low, strobing in row address 196 and bank address 198 for bank 70. At time 200, a CAS signal at CAS input 164 becomes active low, strobing column address 202 into bank 64 and initiating output 204 therefrom. Note that no bank address is needed at column address trapping time, since CAS input 164 corresponds to RAS input 50. Thus, the relevant bank has already been selected. Similarly, at time 206, a CAS signal at CAS input 166 becomes active low, strobing column address 208 into bank 70 and initiating output 210 therefrom. Finally, at time 212, the RAS and CAS signals have all returned to their inactive high state.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A memory bank selection system, comprising:

a plurality of memory banks;

a plurality of asynchronous enable inputs to said plurality of memory banks, wherein said plurality of memory banks exceed in number said plurality of asynchronous enable inputs;

a decoder for decoding a bank address; and a plurality of switches responsive to output from said decoder and said plurality of asynchronous enable inputs for selecting from among said plurality of memory banks such that more than one memory bank may be selected simultaneously, wherein a different address in each of said more than one memory bank may be accessed simultaneously.

2. The memory bank selection system of claim 1 wherein said plurality of memory banks comprise partitions of a memory module.

3. The memory bank selection system of claim 2 wherein said memory module comprises a DRAM memory module.

4. The memory bank selection system of claim 1 wherein said plurality of switches comprise a switch associated with each of said plurality of memory banks, each said associated switch providing a possible connection between a given memory bank and one of said plurality of asynchronous enable inputs.

5. The memory bank of claim 4 wherein each said associated switch comprises a plurality of latches equal in number to said plurality of asynchronous enable inputs.

6. The memory bank selection system of claim 1, wherein said decoder comprises a binary decoder having a number of outputs equal in number to said plurality of memory banks.

7. A memory bank selection system, comprising:

a plurality of memory banks;

a plurality of asynchronous bank enable inputs to said plurality of memory banks, wherein said plurality of memory banks exceed in number said plurality of asynchronous bank enable inputs;

at least one bank output enable input to said plurality of memory banks;

a plurality of bank address inputs for addressing said plurality of memory banks;

a decoder for decoding an addressing signal applied at said plurality of bank address inputs; and a plurality of switches responsive to output signals from said decoder and bank enable signals from said plurality of asynchronous bank enable inputs for selecting from among said plurality of memory banks, wherein more than one memory bank may be simultaneously selected and a different address in each of said more than one memory bank may be accessed simultaneously.

8. The memory bank selection system of claim 7 wherein said plurality of asynchronous bank enable inputs comprise a plurality of row address select inputs and wherein said at least one bank output enable input comprises a column address select input.

9. The memory bank selection system of claim 7 wherein said at least one bank output enable input is a single bank output enable input.

10. The memory bank selection system of claim 7 wherein said at least one bank output enable input are equal in number to said plurality of asynchronous bank enable inputs.

11. A method for selecting from among a plurality of memory banks in a system including a plurality of asynchronous enable inputs and a plurality of bank address inputs, wherein said plurality of memory banks exceed in number said plurality of asynchronous enable inputs, said method comprising steps of:

applying an enable signal at one of said plurality of asynchronous enable inputs;

applying a bank address signal at said plurality of bank address inputs;

decoding said applied bank address signal;

automatically selecting a first memory bank based on said applied enable signal and said decoded bank address signal;

applying an enable signal at another of said plurality of asynchronous enable inputs;

applying a different bank address signal at said plurality of bank address inputs;

decoding said applied a different bank address signal; and automatically selecting a second memory bank based on said enable signal applied at said another of said plurality of asynchronous enable inputs and said decoded different bank address signal, wherein said first memory bank and said second memory bank are simultaneously selected and simultaneously accessed at different addresses.

12. The method of claim 11 wherein said step of applying a bank address signal is performed in response to said applied enable signal.

13. The method of claim 11, wherein said system further includes a plurality of switches connected between said plurality of memory banks and said plurality of asynchronous enable inputs and wherein said step of automatically selecting comprises automatically creating a connection between one of said plurality of asynchronous enable inputs and said first memory bank.

14. A method for selecting multiple memory banks from among a plurality of memory banks in a system including a plurality of asynchronous enable inputs for inputting a first type of memory bank selection signal, at least one other enable input for inputting a second type of memory bank selection signal and a plurality of bank address inputs for inputting a bank addressing signal, wherein said plurality of memory banks exceed in number said plurality of asynchronous enable inputs, said method comprising steps of:

(a) applying a memory bank selection signal of said first type at one of said plurality of asynchronous enable inputs;

(b) applying a bank addressing signal at said plurality of bank address inputs;

(c) applying a memory bank selection signal of said second type at said at least one other enable input;

(d) decoding said applied bank addressing signal;

(e) automatically selecting a memory bank based on said decoded bank addressing signal and said applied memory location addressing signal of said first type and said second type; and (f) repeating steps (a) through (e), wherein at least two of said plurality of memory banks are simultaneously selected, and wherein a different address in each of said at least two of said plurality of memory banks is simultaneously accessed.

15. The memory bank selection method of claim 4, wherein said memory bank selection signal of said first type is a row access selection signal and said memory bank selection signal of said second type is a column access selection signal.

* * * * *

UNITED STATES PATENT AND TRADEMARK OFFICE
CERTIFICATE OF CORRECTION

PATENT NO. : 5,530,836
DATED : June 25, 1996
INVENTOR(S) : Busch et al.

It is certified that error appears in the above-indentified patent and that said Letters Patent is hereby corrected as shown below:

Claim 15, line 35, Col. 8, "4" should be —14—.

Signed and Sealed this

Twenty-fourth Day of September, 1996

Attest:

BRUCE LEHMAN

*Attesting Officer*           *Commissioner of Patents and Trademarks*